United States Patent [19]
Van Gogh et al.

[11] Patent Number: 5,658,442
[45] Date of Patent: Aug. 19, 1997

[54] TARGET AND DARK SPACE SHIELD FOR A PHYSICAL VAPOR DEPOSITION SYSTEM

[75] Inventors: James Van Gogh, Sunnyvale; Fernand Dorleans, San Francisco; Christopher Hagerty, Pleasanton; Mark Lloyd, Fremont; Howard Tang, San Jose; Siyaun Yang, Cupertino; R. Steve West, Boulder Creek, all of Calif.

[73] Assignee: Applied Materials, Inc., Santa Clara, Calif.

[21] Appl. No.: 612,053

[22] Filed: Mar. 7, 1996

[51] Int. Cl.[6] .................................................. C23C 14/34
[52] U.S. Cl. ........................... 204/298.12; 204/298.11; 204/192.12
[58] Field of Search .......................... 204/298.11, 298.12, 204/298.16, 298.17, 298.18, 298.19, 192.12

[56] References Cited

U.S. PATENT DOCUMENTS

| | | | |
|---|---|---|---|
| 3,749,662 | 7/1973 | Biehl | 204/192.12 |
| 4,414,086 | 11/1983 | Lamont, Jr. | 204/298.12 |
| 4,457,825 | 7/1984 | Lamont, Jr. | 204/298.12 |

FOREIGN PATENT DOCUMENTS

| | | | |
|---|---|---|---|
| 0625792 | 11/1994 | European Pat. Off. | 204/298.12 |

Primary Examiner—Robert Kunemund
Assistant Examiner—Rodney G. McDonald
Attorney, Agent, or Firm—Thomason & Moser

[57] ABSTRACT

The disadvantages heretofore associated with the prior art are overcome by the present invention of an improved target for a physical deposition (PVD) system. The improved target has a portion of the target side wall the overhangs and shadows the side wall of the target thus preventing material from depositing on the edge. To further reduce contaminant generation, the improved target is combined with an improved dark space shield having a first end and a second end, where the second end conventionally supports a collimator and the first end has an inner surface that is substantially vertical.

6 Claims, 2 Drawing Sheets

5,658,442

TARGET AND DARK SPACE SHIELD FOR A PHYSICAL VAPOR DEPOSITION SYSTEM

BACKGROUND OF THE DISCLOSURE

1. Field of the Invention

The invention relates to a physical vapor deposition system and, more particularly, to an improved target and dark space shield for improving particle performance within such a system.

2. Description of the Background Art

FIG. 1 depicts a simplified, cross-sectional view of a conventional physical vapor deposition (PVD) system 100. The system contains, within a system housing 101, a substrate support assembly 102, a shield ring 104, a plasma shield 106, a dark space shield 108, a collimator 110, and a target 112. These elements of the PVD system are conventionally arranged within the housing 101. When a gas, such as argon, is pumped into region 120 and high voltage is applied between the target 112 and the substrate support 102, the argon forms a plasma within region 120. The plasma sputters the target material which ultimately is deposited upon a substrate 122.

The target 112 is fabricated of a backing plate 114 (typically aluminum) that has a target material to be sputtered (e.g., titanium) diffusion bonded as a target layer 116 upon its surface. Besides the foregoing target, other target designs are used in the art. For example, the target backing plate may be cup or dish shaped, i.e., having a hollow center, rather than a solid plate.

The dark space shield 108, besides supporting the collimator 110, also shields the backing plate from being sputtered. Sputtering the backing plate would generate particles of the backing plate material which would contaminate the substrate. As such, it is important that only the target layer is sputtered and not the backing plate material. As such, the dark space shield is positioned in close proximity (approximately 0.065 inches) to the target. Such a small gap prevents the plasma from leaking into the gap and sputtering the backing plate.

To further illustrate the relationship between the dark space shield and the target, FIG. 1A depicts a detailed, cross-sectional view of the interface area. The target 112 is maintained in a spaced-apart relation relative to the dark space shield by an insulator ring 124. Although the dark space shield and the target are near enough to one another to prevent the plasma from sputtering the backing plate, the gap 126 is large enough to permit sputtered material from the target layer 116 to enter the gap 126 and deposit upon the curved portion 134 of the backing plate 114 and the side wall 128 of the target layer 116. This phenomenon is known in the art as backscatter deposition. The deposition occurs from particles having trajectories illustrated by arrows 130. Assuming a target support surface 136 is horizontally disposed, the deposition occurs in the region where an angle between the target side wall and the target support surface 136 is greater than ninety degrees. As such, deposition in the gap will occur for all particles having trajectories that are on a line-of-sight path with the backing plate and target layer edge. The angle within which particles are line of sight to the gap 126 is shown as reference number 132.

Deposition onto the curved portion 134 of the backing plate 114 and the side wall 128 of the target layer 116 is detrimental to a PVD process. For example, the deposition upon the side wall of the target layer and the curved portion of the backing plate occurs along an oblique angle to these surfaces. As such, when the temperature of the target changes and causes the target to expand or contract, the deposited material (or portion thereof) dislodges from the surface and may fall upon the substrate. Consequently, the substrate would be contaminated.

Therefore, a need exists in the art for an improved target and dark space shield that reduces the deposition of material in the gap between the shield and the target.

SUMMARY OF THE INVENTION

The disadvantages heretofore associated with the prior art are overcome by the present invention of an improved target for a physical vapor deposition (PVD) system. The improved target has a portion of the target side wall that shadows the side wall of the target thus preventing material from depositing on the side wall.

More specifically, the improved target has a central region which contains the sputterable material. From the central region radially extends a flange having a support surface for mounting the target within a PVD system. As such, the target has a first corner formed at the junction of the edge (also known as a side wall) of the target and the flange. A second corner is formed at the distal end of the edge. The central region has side edges that slope from the second corner of the target inward toward the first corner, i.e., the first corner "overhangs" or "shadows" the second corner. Thus, in a target with a horizontally disposed flange, the angle of the target side wall relative to the support surface of the flange is less than or equal to ninety degrees (e.g., the side wall is a reentrant side wall). Consequently, due to the portion of the target that overhangs (or is evenly aligned with) the side wall, particles within the chamber cannot have a line of sight trajectory that impacts the side wall of the target.

In an additional embodiment of the invention, the invention further includes a dark space shield having a first end and a second end, where the second end conventionally supports a collimator. However, the first end has an inner surface that is perpendicular to the support surface of the target, i.e., the inner surface is substantially vertical.

By using the improved target and dark space shield, the amount of material deposited in the gap is substantially reduced. Consequently, the invention improves the yield of non-contaminated substrates processed by a PVD system.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is an improved target and dark space shield for a physical vapor deposition (PVD) system. To substantially eliminate deposition of sputtered particles upon the side wall of the target, a portion of the target side wall shadows the side wall of the target. To further lessen the deposition in the gap between the dark space shield and the target, the dark space shield has a vertical inner surface. Although the improved target alone substantially reduces the potential for contaminant generation, the combination of the improved target and the improved dark space shield further reduces the potential for substrate contamination.

Figures 1, 1A:
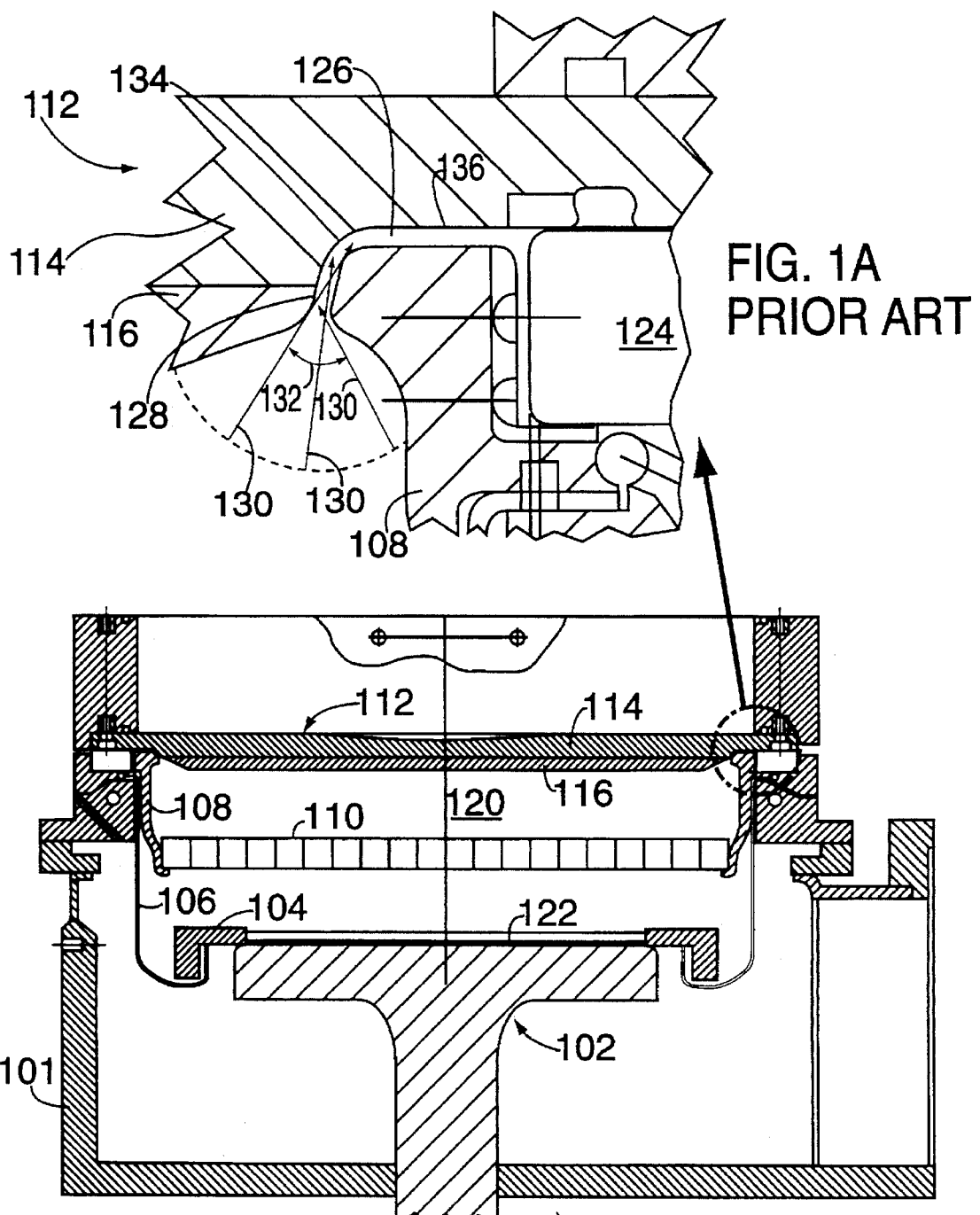
FIG. 1 depicts a simplified, cross-sectional view of a conventional physical vapor deposition (PVD) system.
FIG. 1A depicts a detailed, cross-sectional view of the relationship between a conventional target and a convention dark space shield.
Figure 2:
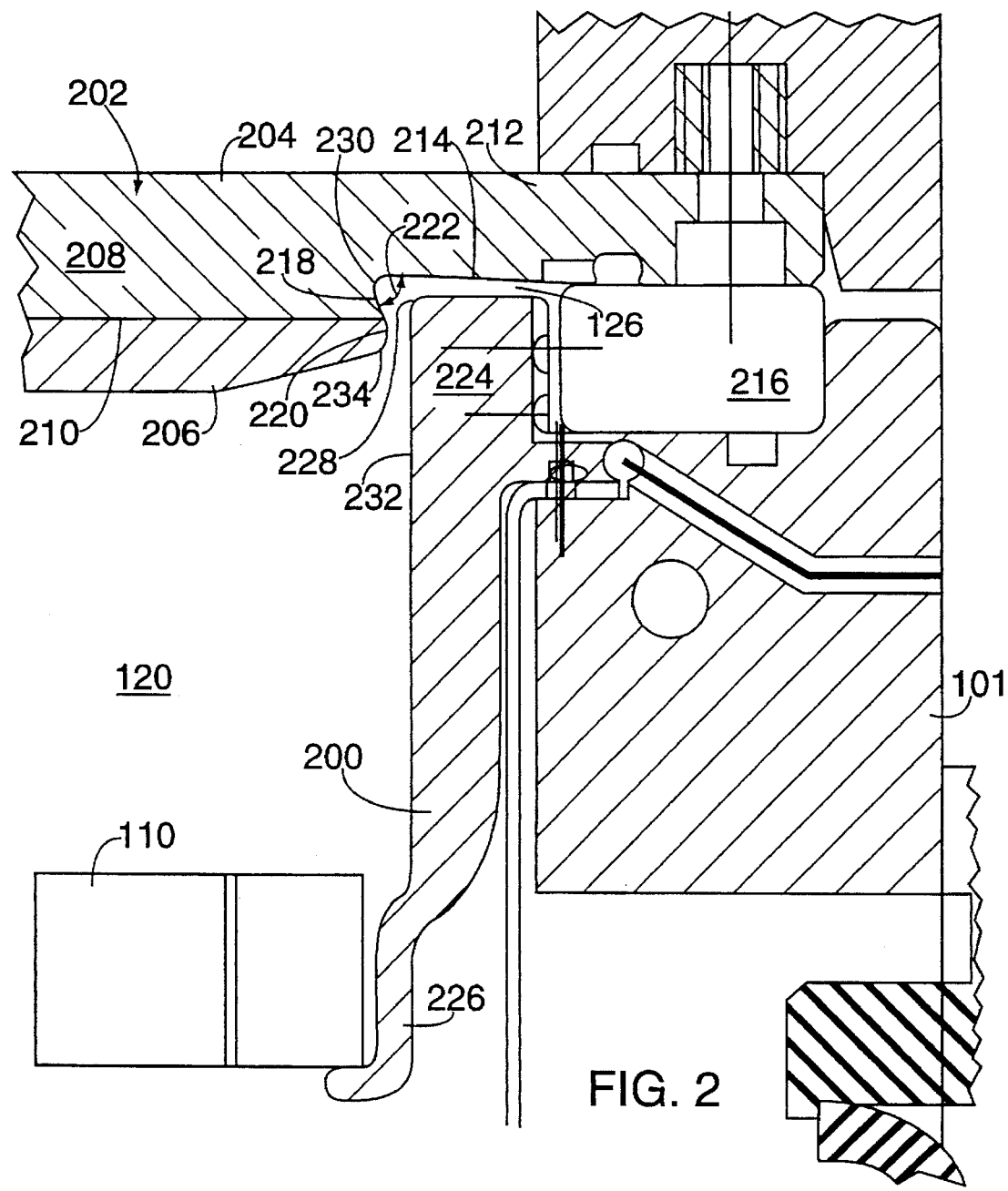
FIG. 2 depicts a cross-sectional view of an improved target and dark space shield of the present invention.

More specifically, FIG. 2 depicts a detailed cross-sectional view of a dark space shield 200 and target 202 of the present invention. The target contains a backing plate 204 having a target layer 206 diffusion bonded upon its surface. The backing plate is typically formed of aluminum and the target layer is typically formed of a material such as titanium or some other sputterable material. Although the target is discussed herein as having a diffusion bonded surface of target material, those skilled in the art should realize that the target could comprise a single sputterable material such as aluminum, titanium, or the like. Additionally, the particular target design shown and described herein should be considered illustrative rather than limiting the invention to a specific type or style of target. Other target styles such as dish or cup-shaped targets would also benefit from the present invention.

The backing plate has a central area 208 that contains the surface 210 upon which the target layer is diffused. From this central area of the backing plate extends a target support flange 212 having a generally horizontal target support surface 214. The target support surface 214 abuts and rests upon an insulator ring 216 that also forms a seal between the target and a system housing 101.

In accordance with the present invention, a portion of the target, e.g., corner 234, overhangs and shadows the side wall of the target, e.g., the side wall 218 of the central region 208 of the backing plate 202 and the side wall 220 of the target layer 206 (cumulatively referred to as the target edge). As such, particles within the reaction region 120 cannot have a line of sight trajectory that impacts the target edge. Thus, oblique angle impacts are eliminated. Particles may still enter the gap along a vertical path; however, those particles will impact the support surface 214 at a perpendicular angle of incidence. Generally, a perpendicular angle of incidence is more adhesive than an oblique angle of incidence.

The dark space shield 200 has a first end 224 and a second end 226. The second end is formed in a conventional manner e.g., supports a collimator 110. The dark space shield 200 is supported by the housing 101 proximate the target 202. More specifically, the support surface is spaced from the first end 224 of the shield by approximately 0.060 inches. The furthest spacing, between corner 228 of the shield and corner 230 of the target is approximately 0.076 inches. The radius 222 of the corner 230 is approximately 0.080 inches. At no point in the gap 126 should the spacing between the target and the dark space shield exceed 0.080 inches or the plasma could leak into the gap and sputter the backing plate.

To reduce particle deposition on the side wall of the target, the dark space shield has an inner surface 232 that is vertical, e.g., orthogonal to the horizontal target support surface 214. This vertical surface further reduces the ability of sputtered particles to deposit upon the target side wall 218 and 220 or the corner 230.

Although the improved target can be used without the improved dark space shield to reduce the potential for contaminant generation, a combination of both the improved target and shield produce superior results. Furthermore, empirical data indicates that the best combination uses a target having a side wall that is substantially perpendicular to the support surface and a shield with an inner surface that is substantially perpendicular to the support surface. As such, the target side wall and the inner surface of the shield have a spaced-apart, parallel relationship.

Although various embodiments which incorporate the teachings of the present invention have been shown and described in detail herein, those skilled in the art can readily devise many other varied embodiments that still incorporate these teachings.

What is claimed is:

1. A target for a physical vapor deposition system comprising:

a central region, being the region to be sputtered, having a center and an edge, the edge having an inclined sidewall connecting a first corner to a second corner;

a flange, radially extending from the central region at said second corner, having a support surface for supporting said target within said physical vapor deposition system in a parallel spaced apart relation to a substrate support surface of a substrate support assembly; and the first corner being further from said center of said central region than the second corner, where the first corner forms an overhang that shadows the second corner, the edge and the flange, to impede deposition of sputtered material upon said inclined side wall.

2. The target of claim 1 wherein said central region further comprises a layer of sputterable material.

3. Apparatus for a physical vapor deposition system comprising:

a target comprising:

a central region, being the region to be sputtered, having a center and an edge, the edge having an inclined sidewall connecting a first corner to a second corner;

a flange, radially extending from the central region at said second corner, having a support surface for supporting said target within said physical vapor deposition system in a parallel spaced apart relation to a substrate support surface of a substrate support assembly; and the first corner being further from said center of said central region than the second corner, where the first corner forms an overhang that shadows the second corner, the edge and the flange, to impede deposition of sputtered material upon said inclined sidewall; and a dark space shield, mounted proximate said first corner of said target, to form a gap between said dark space shield and said support surface and said edge.

4. The apparatus of claim 3 wherein said central region further comprises a layer of sputterable material.

5. The apparatus of claim 3 wherein said dark space shield further comprises an inner surface that is orthogonal to said support surface.

6. The apparatus of claim 3 wherein said dark space shield further comprises cylindrical inner surface, extending from a first end positioned proximate said target to a second end, adapted to support a collimator.

* * * * *